United States Patent [19]

Söderström

[11] Patent Number: 4,843,345

[45] Date of Patent: Jun. 27, 1989

[54] OUTPUT STAGE WITH AUTOMATIC LEVEL CONTROL FOR POWER LINE SIGNALLING

[75] Inventor: Leif E. Söderström, Linköping, Sweden

[73] Assignee: Telefonaktiebolaget L M Ericsson, Stockholm, Sweden

[21] Appl. No.: 115,880

[22] Filed: Nov. 2, 1987

[30] Foreign Application Priority Data

Nov. 11, 1986 [SE] Sweden .................................. 8604821

[51] Int. Cl.$^4$ ............................................. H03G 3/20
[52] U.S. Cl. ..................................... 330/282; 330/129
[58] Field of Search ................. 330/278, 282, 129, 144

[56] References Cited

U.S. PATENT DOCUMENTS 3,879,672  4/1975  Milanes .
4,066,977  1/1978  Chambers et al. ................... 330/129
4,451,801  5/1984  Monticelli .

*Primary Examiner*—Gene Wan
*Attorney, Agent, or Firm*—Burns, Doane, Swecker & Mathis

[57] ABSTRACT

An output stage with automatic level control for power line signalling, including a controlled amplifier ($F_1$) and a feedback circuit for sensing the output voltage ($V_0+v_0$) of the output stage and for supplying a control signal ($v_4$) to a control input of the controlled amplifier ($F_1$). The feedback circuit includes a comparator (K) for comparing an alternating voltage ($v_1$) which is responsive to the alternating voltage component ($v_0$) at the output stage and which is furthermore superposed on a first direct voltage ($V_1$) with a second direct voltage ($V_2$). As control signal to the controlled amplifier ($F_1$) there is utilized the voltage ($v_4$) across the capacitor ($C_4$), the voltage of which increases or decreases in response to the comparison result of the comparator (K). The amplitude of the alternating voltage component at the output of the output stage can thus be kept to a substantially constant value determined by the first and second direct voltages ($V_1$ and $V_2$).

6 Claims, 2 Drawing Sheets

OUTPUT STAGE WITH AUTOMATIC LEVEL CONTROL FOR POWER LINE SIGNALLING

TECHNICAL FIELD

The invention relates to an output stage with automatic level control for power line signalling, including a controlled amplifier and a feedback circuit for sensing the output voltage of the output stage and feeding a controlled signal to a control input of the controlled amplifier.

BACKGROUND ART

An apparatus of the kind given above is described in the U.S. Pat. No. 4,451,801. The voltage amplitude of the signal fed to the power line is responsive to the size of the supply voltage of the apparatus, and the voltage amplitude is limited automatically if it tends to be too high in relation to the supply voltage, which can depend on high power line impedance.

DISCLOSURE OF INVENTION

The object of the present invention is to provide an output stage of the kind mentioned in the introduction, where the voltage amplitude of the output signal can be selected in a simple way and simultaneously independent of the power line impedance, the input signal amplitude and the magnitude of the supply voltage, at least within certain limits. In addition, variation from high to very low values for the output signal shall be enabled. This is achieved by an alternating voltage responsive to the alternating voltage component on the output of the output stage and furthermore superposed on a direct voltage being compared with a second direct voltage, the voltage across a capacitor connected to a control input of the controlled amplifier being increased or decreased in response to the comparison result present. The amplitude of the alternating voltage component at the output of the output stage can thus be kept at a substantially constant value which is determined by both direct voltages.

The distinguishing features of the invention are apparent from the claims.

BRIEF DESCRIPTION OF DRAWINGS

The invention will now be described in detail with reference to the drawings, on which

BEST MODES FOR CARRYING OUT THE INVENTION

Figure 1:
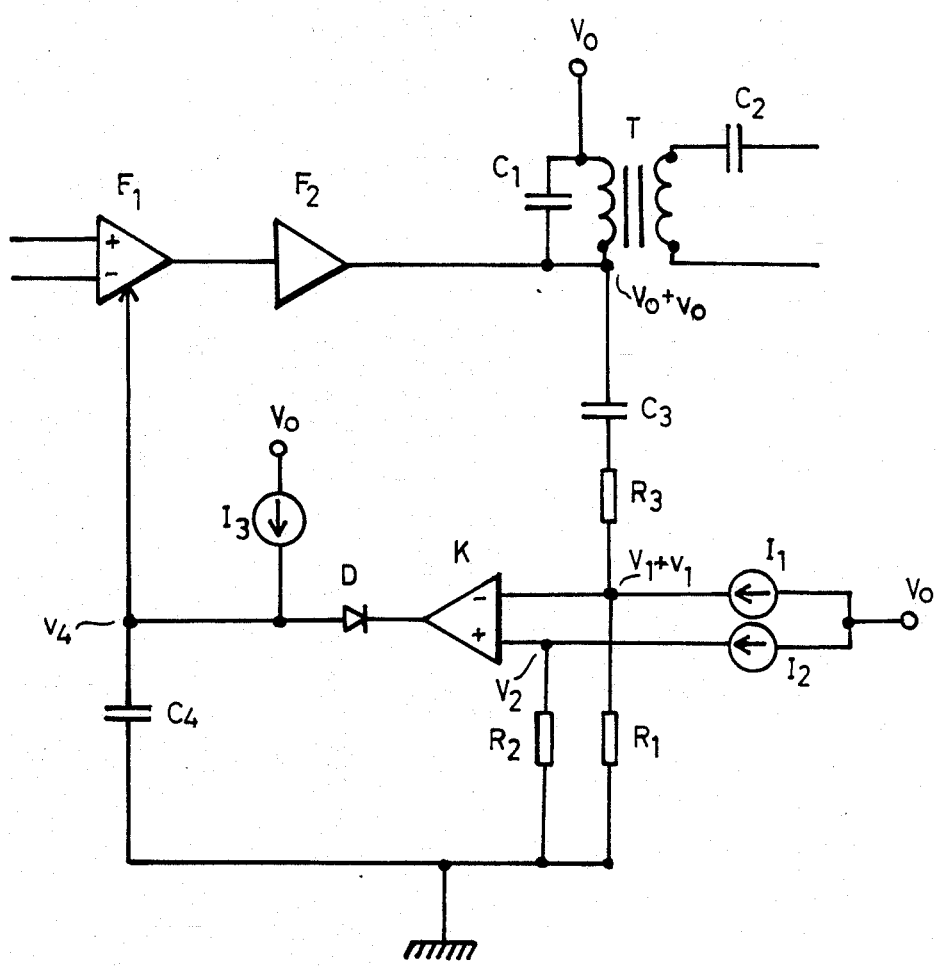
FIG. 1 illustrates an embodiment of an output stage in accordance with the invention.

An embodiment of an output stage in accordance with the invention is illustrated in FIG. 1. The output stage input comprises a differential input of a voltage controlled amplifier $F_1$ with a gain of up to about 25 times. The controlled amplifier is connected to a power amplifier $F_2$, which is suitably a class-A stage, the task of which is to give the output stage a sufficient current drive capacity. The power amplifier output is connected conventionally to the power line, e.g. a 220 volt mains, on which signalling shall take place via a tuned circuit $C_1$-$L_1$, a transformer T and a capacitor $C_2$. $V_O$ denoting the supply voltage of the output stage.

During operation, an output signal comprising an alternating voltage $v_O$ which is superposed on the supply voltage $V_O$ occurs at the output of the power amplifier $F_2$. This output signal is supplied not only to the transformer T, but also to a feedback circuit between the power amplifier output and a control input of the controlled amplifier $F_1$. The supplied voltage $V_O$ is blocked in the capacitor $C_3$ and the alternating voltage $v_O$ is supplied to a voltage divider $R_3$, $R_1$. A comparator denoted by K is adapted to compare the sum of a first direct voltage $V_1$ and the alternating voltage $v_1$ which is obtained at the output of the voltage divider with a second direct voltage $V_2$. The direct voltages $V_1$ and $V_2$ are obtained across their respective resistors $R_1$ and $R_2$ with the aid of two current generators $I_1$ and $I_2$.

The gain of the controlled amplifier $F_1$ is determined by the voltage $v_4$ across a capacitor $C_4$. The capacitor is charged by a current generator $I_3$ during the times when the voltage $V_1+v_1$ is less than the voltage $V_2$ and is discharged via the comparator K during the times when the voltage $V_1+v_1$ is greater than the voltage $V_2$.

Figure 2:
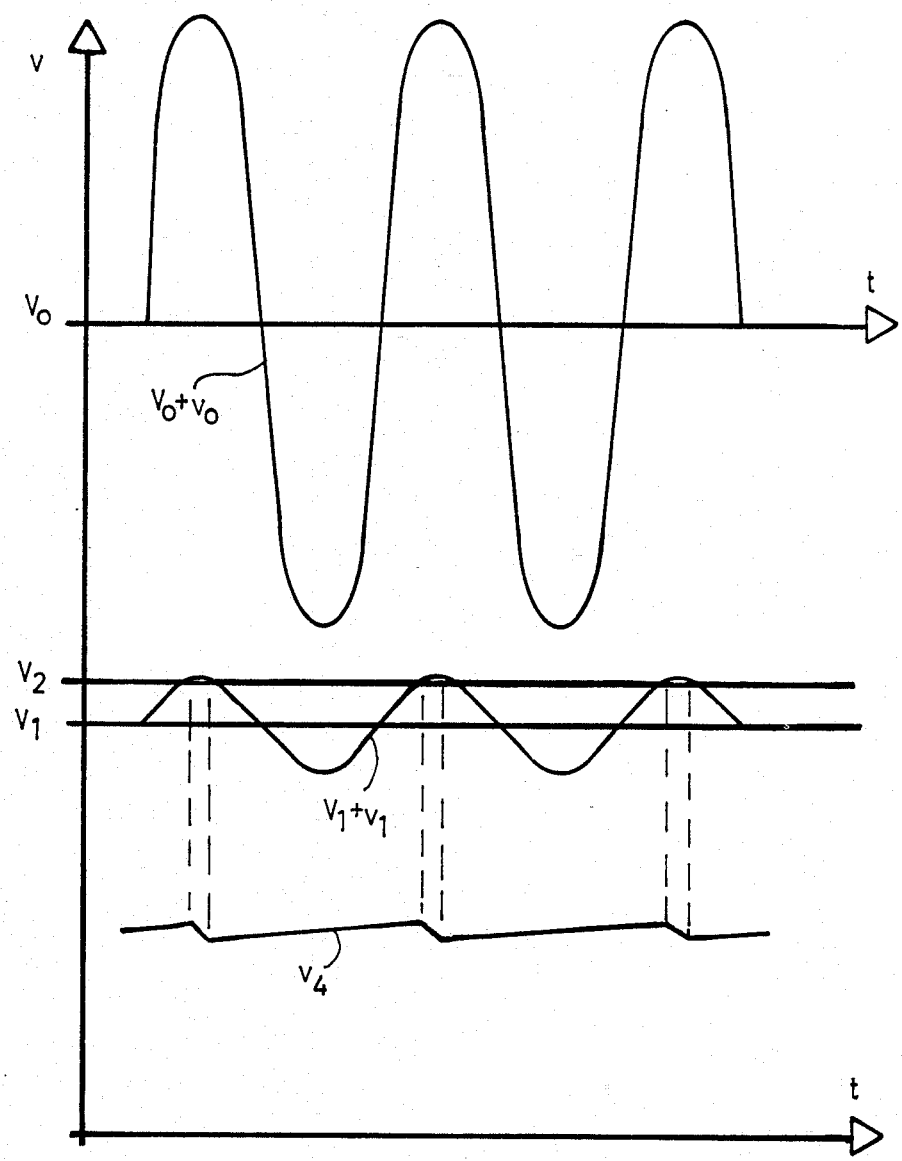
FIG. 2 is a timing charge illustrating the voltages in certain points of the output stage in FIG. 1.

In the following it is assumed that the resistor $R_1$ has the resistance $R_1$ ohms, the current generator $I_1$ generates the current $I_1$ amps and so on. In the following, FIG. 2 is also referred to, this being a timing chart of the voltages at certain points in the output stage. More specifically, the direct voltages $V_O$, $V_1$ and $V_2$ as well as the alternating voltages $V_O+v_O$, $V_1+v_1$ and $v_4$ are shown.

Since the supply voltage $V_O$ is blocked in the capacitor $C_3$, the voltage fed back and thus also the voltage amplitude of the alternating voltage component $v_O$ in the output signal from the output stage will be independent of the supply voltage. The condition for the compartor K to function with the desired result in the feedback circuit is that its input voltages are kept within a certain amount of margin between zero volts and the supply voltage $V_O$. Downward division of the alternating voltage component $v_O$ from the output of the power amplifier $F_2$ to the alternating voltage $v_1$ in the voltage divider $R_3$, $R_1$ and the superposition of this on the direct voltage $V_1$ enables the feed-back circuit to function for relatively high output signal levels from the power amplifier $F_2$. The graphs illustrated in FIG. 2 correspond to a down division up to one fifth. The voltage $V_1$ should suitably be equal to about half the supply voltage, which gives the greatest possible margin to the zero voltage and to the supply voltage $V_O$. The feedback circuit functions also for very low output signal levels. For low output signal levels no down division is necessary, however, i.e. the resistor $R_3$ can then be excluded. However, the resistor $R_1$ is required for both high and low output signal levels, since the alternating voltage $v_1$ must be superposed on a direct voltage for the input voltage of the comparator K always to exceed zero volts.

The value of the capacitance $C_4$, the charging current $I_3$ and the current with which the capacitor is discharged through the comparator K determines, inter alia, how rapidly the control takes place after a load change on the power line. The discharge current is suitably about 100 times greater than the charging current $I_3$. For equilibrium, the capacitor is here discharged during about 1% of the total time, which results in that the top value of the sum of voltages $V_1+v_1$ will only insignificantly exceed the direct voltage $V_2$. See FIG. 2. The capacitance $C_4$ should be sufficiently large for the voltage across it not to be changed as much during a period that distortion occurs. The voltage $v_4$ across the capacitor $C_4$ will thus substantially be a direct voltage, the magnitude of which is responsive to the power line impedance and to the desired voltage amplitude of the output state output signal.

If the currents $I_1$ and $I_2$ are equally as great and have the value $I_O$, there is the approximate relationship (1) $R_1 \times I_O + v_{10} = LR_2 \times I_O$, where $v_{10}$ denotes the top value of the voltage $v_1$. If $v_{OO}$ denotes the top value of the alternating voltage component $v_O$, there is also applicable the approximate relationship (2) $v_{10} = v_{OO} \times R_1/(R_1 + R_3)$.

If (2) is inserted in (1) there is obtained that $v_{OO} = (R_2 - R_1) \times I_O \times (R_1 + R_3)/R_1$, i.e. $v_{OO}$ is approximately proportional to $IR_2 - R_1$. The desired voltage amplitude of the output signal can be obtained therefrom, e.g. via suitable selection of the resistor $R_2$.

The amplifiers $F_1$ and $F_2$, comparator K, diode D and current generators $I_1-I_3$ are suitably included in a single integrated circuit in practice, where the illustrated resistors, capacitors and coils are outside it, and thus can be adapted to the desired application. For example, it is essential that the resistor $R_2$ can be selected in dependence on the desired output signal level. Furthermore, the down division resistor $R_3$ should be able to be matched to the output signal level so that the alternating voltage component $v_1$ will be appropriately great.

An overvoltage protector for protecting against heavy transients from the power line is suitably applied in practice to the illustrated output stage outside the mentioned integrated circuit. Such a protector may be, for example, a resistor in series with the output of the power amplifier $F_2$ together with a Zener diode between the same output and ground. For the current sources $I_1$ and $I_2$ to give just as great and well defined currents irrespective of the supply voltage $V_O$ and the temperature, the integrated circuit is suitably provided with a voltage to current converter, which generates a current from the reference voltage, e.g. from a band gap reference. A reference resistor associated with the convertor is also suitably placed outside the integrated circuit so that the resistance of the resistor can be well defined and independent of temperature. A second, equally as great current can be conventionally generated by current mirroring.

More exact sensing of the amplitude sent to the power line can be achieved by a further balanced circuit comprising a capacitor and a coil connected in series with the balanced circuit $C_1$-$L_1$. The coil shall then be inductively connected to the transformer T, and the voltage $V_O$ shall be connected between both balanced circuits. Here the capacitor $C_3$ is connected to the balanced circuit added in this way, instead of to the circuit $C_1$-$L_1$.

The currents $I_1$ and $I_2$ are, for example, $200 \times 10^{-6}$ A. For a supply voltage of about 5 V the resistance $R_1$ is selected to be about $12.5 \times 10^3$ ohm, whereby the voltage $V_1$ is given the value 2.5 V. The capacitors $C_3$ and $C_4$ may each have, for example, a capacitance of 50 nF. The current $I_3$ is, for example $2 \times 10^{-6}$A.

As mentioned above, there is obtained an output stage with the described embodiment for power line signalling with which the voltage amplitude of the output signal is independent of the input signal amplitude, feed voltage magnitude and the power line impedance. In addition, a desired amplitude can be set in a simple way by suitable selection of the resistance of the resistor $R_2$, for example, and can thus be caused to vary between high and very low values.

The described embodiment can of course be altered within the scope of the patent claims. For example, the direct voltage $V_1$ and $V_2$ can be partially built up via diodes in series with the resistors $R_1$ and $R_2$. The number of diodes in series with each of the resistors is namely equal to three in such a case, which gives a voltage equal to just over two volts across each diode chain. With retained current strength from the current generators $I_1$ and $I_2$ the resistance $R_1$ may be selected to be about $2 \times 10^3$ ohm. The resistances $R_2$ and $R_3$ must also be matched to this embodiment. In the case where certain components are included in a single integrated circuit, as proposed above, the series-connected diode should also be included in this circuit. It is also conceivable to replace the current generator $I_2$, resistor $R_2$ and optional diodes in series with it by a voltage source generating the voltage $V_2$. It is naturally also conceivable to alter the illustrated circuits in a way such that the voltage across the capacitor $C_4$ decreases instead of increases when $V_1 + v_1$ are less than $V_2$ and vice versa.

I claim:

1. An output stage with automatic level control for power line signalling, comprising:
    controlled amplifier means, having a control input for receiving a control signal for amplifying an input signal and producing at least one output signal, said output signal having a direct voltage component and an alternating voltage component,
    feedback means for sensing said output signal of the output stage and supplying said control signal to said controlled amplifier means, said feedback means further comprising;
    a first capacitive element connected to said control input for supplying said control signal,
    voltage varying means for changing the voltage across said first capacitive element including a comparator means for comparing the sum of a first direct reference voltage and an alternating voltage which is proportional to said alternating voltage component with a second direct voltage, and a first current source,
    whereby said voltage across said capacitive element is changed in one direction when said sum is less than said second direct reference voltage and in the other direction when said sum is greater than said second direct reference voltage to thereby maintain the voltage amplitude of said alternating voltage component at a substantially constant value as determined by said first and said second direct reference voltages.

2. An output stage according to claim 1, wherein said feedback means further includes a first series circuit having a second capacitive element for blocking said direct voltage component and a first resistor, and a second current generator connected to a first point located between said second capacitive element and said first resistor to provide said first direct reference voltage at said first point.

3. An output stage according to claim 2, wherein said feedback means further includes a second series circuit having a second resistor and third current generator for providing said second direct reference voltage at a second point.

4. An output stage according to claim 2 wherein said first series circuit further includes a third resistor situated on the same side of said first point as said second capacitive element.

5. An output stage according to claim 1 wherein said voltage across said first capacitive element is varied in one direction by a current supply from or to said first current source and is varied in the other direction by a current supply from or to the comparator means.

6. An output stage according to claim 1 wherein said alternating voltage is comprised of a predetermined portion of said alternating voltage component.

* * * * *